United States Patent [19]

Aiba et al.

[11] Patent Number: 4,878,225
[45] Date of Patent: Oct. 31, 1989

[54] CONTROLLING APPARATUS FOR LASER DIODE

[75] Inventors: Masahiko Aiba, Nara; Yukio Mizuno, Yamatokoriyama, both of Japan

[73] Assignee: Sharp Kabushiki Kaisha, Osaka, Japan

[21] Appl. No.: 326,453

[22] Filed: Mar. 20, 1989

Related U.S. Application Data

[63] Continuation of Ser. No. 89,532, Aug. 26, 1987, abandoned.

[30] Foreign Application Priority Data

Aug. 26, 1986 [JP] Japan ............................... 61-200404
Aug. 27, 1986 [JP] Japan ............................... 61-202467

[51] Int. Cl.$^4$ .............................................. H01S 3/00
[52] U.S. Cl. ...................................... 372/38; 372/29; 372/30
[58] Field of Search ................... 372/8, 9, 25, 29, 30, 372/33, 38

[56] References Cited

U.S. PATENT DOCUMENTS 4,237,427 12/1980 Holland ................................. 372/29

Primary Examiner—William L. Sikes
Assistant Examiner—B. R. R. Holloway
Attorney, Agent, or Firm—Birch, Stewart, Kolasch & Birch

[57] ABSTRACT

A controlling apparatus for a laser diode which is used in a laser printer or the like to transmit laser beam light rays. According to the output characteristics of the laser diode, a bias is applied in the current region (from 0 to Ixm) of approximately 0 in radiation output. The control object period (from Ix to Ixm) is divided into many stages to perform the radiation output control so as to effect the high-precision output control without the provision of a more complicated circuit. The central processing unit outputs the control signal into the duty controlling means, so that the output of the laser diode may be automatically held constant in accordance with the predetermined process or the operation arranged in advance.

13 Claims, 5 Drawing Sheets

CONTROLLING APPARATUS FOR LASER DIODE

This application is a continuation of application Ser. No. 089,532 filed on Aug. 26, 1987, now abandoned.

BACKGROUND OF THE INVENTION

The present invention generally relates to a controlling apparatus for a laser diode which is used in a laser printer or the like to transmit laser beam light rays.

Generally the output characteristics of the laser diode are shown in FIG. 2. Conventionally, the current from 0 to In has been divided into many stages to control the radiation output. Such output control as described hereinabove has been performed by a circuit or the like.

In the output control of the conventional laser diode, the control object period is from 0 to In of the output characteristics of the laser diode, so that the high-precision controlling operation cannot be performed by the circuit or the like, and a complicated circuit is required to perform this high-precision control.

SUMMARY OF THE INVENTION

Accordingly, an object of the present invention is to provide a controlling apparatus for a laser diode. Wherein according to the output characteristics of the laser diode, the bias applied in the current region (from 0 to Ixm) is approximately 0 in radiation output, and the control object period (from Ixm to In) is divided into many stages for performing the radiation output control so the high-precision output is performed without the provision of a more complicated circuit.

In accomplishing the object, according to one preferred embodiment of the present invention, a controlling apparatus for a laser diode is provided which comprises a duty controlling means capable of varying the duty into the pulse of a laser power control signal in accordance with a control signal to be inputted, a smoothing means for smoothing the laser power control signal controlled in duty by the duty controlling means, a current conversion means for feeding the signal smoothed by the smoothing means into the laser diode, an applying means for applying a given bias current into the laser diode, a comparing means for comparing the monitor output of the laser diode with the predetermined reference voltage, and a central processing unit which responds to the output from the comparing means to guide a control signal into the duty controlling means to variably instruct the pulse duty of the laser power control signal. Accordingly, the duty controlling means varies the pulse duty of the laser power control signal in accordance with the control signal to be inputted from the central processing unit to output the signal into the smoothing means. The smoothing means smooths the laser power control signal into the DC analog signal to feed the current into the laser diode through the current conversion means. Also, as the predetermined current is normally applied upon the laser diode by the bias applying means, the bias current and the current from the current conversion means are added. The monitor output of the current-fed laser diode is compared with the predetermined reference voltage by the comparing means.

According to this result, the central processing unit outputs the control signal into the duty controlling means, so that the output of the laser diode may be automatically held constant in accordance with the predetermined process.

Also, the present invention comprises a duty controlling means which is capable of varying the duty into the pulse of a laser power control signal in accordance with a control signal to be inputted, a smoothing means for smoothing the laser power control signal controlled in duty by the duty controlling means, a current conversion means for feeding into the laser diode the signal smoothed by the smoothing means, a limiting means for restricting the top limit of the current to be fed into the laser diode, a comparing means for comparing the monitor output of the laser diode with the predetermined reference voltage, and a central processing unit which responds to the output from the comparing means to guide a control signal into the duty controlling means to variably instruct the pulse duty of the laser power control signal.

Accordingly, the duty controlling means varies the pulse duty of the laser power control signal in accordance with the control signal to be inputted from the central processing unit for outputting the signal into the smoothing means. The smoothing means smooths the laser power control signal into the DC analog signal to feed the current into the laser diode through the current conversion means. When the light output that has been provided from the laser diode is greater than or equal to a predetermined value, the circuit to feed the current into the laser diode is compulsorily cut out. Also, the monitor output of the current-fed laser diode is compared with the predetermined reference voltage by the comparing means. According to this result, the central processing unit outputs the control signal into the duty controlling means, so that the output of the laser diode may be automatically held constant in accordance with the operation arranged in advance.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
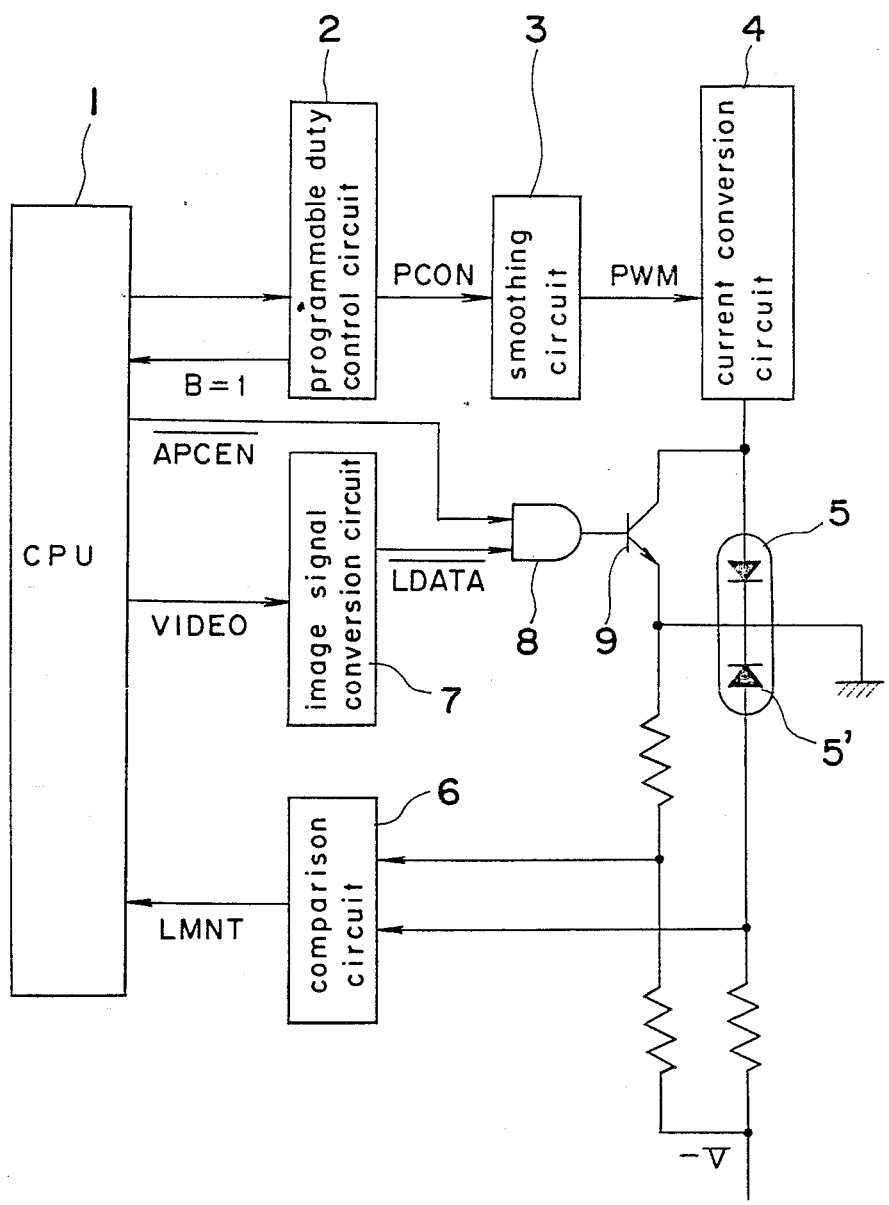
FIG. 1 is a circuit block diagram of the controlling apparatus for a laser diode of the present invention.

Before the description of the present invention proceeds, it is to be noted that like parts are designated by like reference numerals throughout the accompanying drawings.

Figure 2:
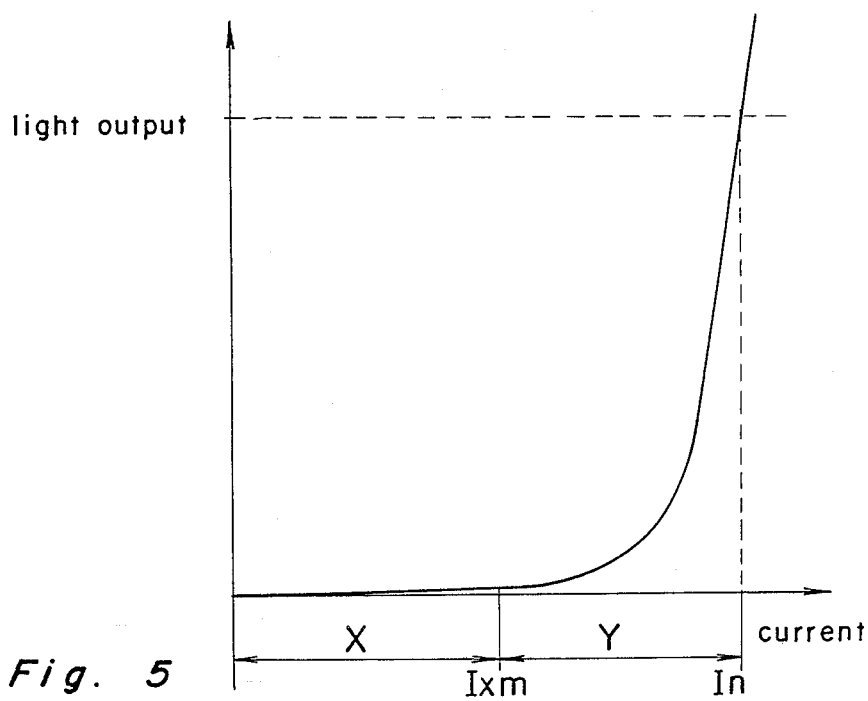
FIG. 2 is a chart showing the relationship between the light output and the current value to be fed into the laser diode of the apparatus.

Referring now to the drawings, there is shown in FIG. 1 an automatic output controlling apparatus for a laser diode using a laser printer according to one preferred embodiment of the present invention. The apparatus includes a central processing unit (CPU) 1, and a programmable duty control circuit 2. The programmable duty control circuit 2 to programmably control the pulse duty of the laser power control signals (hereinafter referred to as PCON) into many stages in accordance with control signals to be inputted from the CPU 1. A smoothing circuit 3 is provided to smooth the duty-controlled laser power control signals into the DC analog signals as pulse wide modulation signals (hereinafter referred to as PWM). A current conversion circuit 4 controls the service current into a laser diode 5 which transmits laser beams. The current conversion circuit biases the lowest threshold value current of the laser diode 5 and also feeds a predetermined current into the laser diode 5. Also, the laser diode 5 has a PIN diode 5' therein, which is a light receiving element for monitoring purposes. A comparison circuit 6 compares an output voltage from the PIN diode 5' with a reference voltage. The outputs from the comparison circuit 6 are inputted into the central processing unit 1 as the reference signal LMNT. The pulse duty of the PCON signal is controlled by the duty controlling circuit 2 in accordance with the control signal to be inputted from the CPU 1. An image signal conversion circuit latches the VIDSO signal for image printing by a D-type flip-flop so as to output the VIDEO signal as the printing signal DATA/. An AND gate 8 and a transistor 9 turn the laser diode 5 on and off by the $\overline{\text{LDATA}}$ or the $\overline{\text{APCEN}}$ signal. The $\overline{\text{APCEN}}$ signal becomes "high" during an automatic power control period. The flowing into the laser diode 5 increases as the "high" period of the PCON signal becomes longer. Accordingly, the ON duty of the PCON signal is increased so that the current flowing into the laser diode 5 may increase when the output of the laser diode 5 has been lowered, whereby the contrast laser output is held. The laser power control signal PCON is inputted into the smoothing circuit 3 by the programmable duty controlling circuit 2, and is outputted into the current converting circuit 4 as the pulse wide modulation signal PWM so as to control the current of the laser diode 5. The current conversion circuit 4 steadily adds the given bias into the laser diode 5. The light output of the laser diode 5 is approximately zero in the low current region (to Ixm from 0) as shown in FIG. 2, with the actual control object period being applied only to the Y portion (from Ixm to In). Therefore, it is necessary for the bias to be added in advance only for the Y portion.

Also, the VIDEO signal is latched by the D type flip-flop of the process control unit 7 so as to be outputted as the $\overline{\text{LDATA}}$. When the $\overline{\text{LDATA}}$ is "high" in the AND gate 8, the current of the laser diode 5 bypasses a transistor 9 to turn off the laser so as to form a non-exposure portion on the sensitive member. The laser diode 5 has a PIN diode 5' for monitoring use as described hereinabove so that the output current of the PIN diode 5' is used to adjust the light output and to prevent the failure with respect to the excessive radiation. The reference signal LMNT for the automatic power control is generated after the output current of the PIN diode has been converted to a voltage and compared with the reference voltage by the comparison circuit 6.

Figure 3:
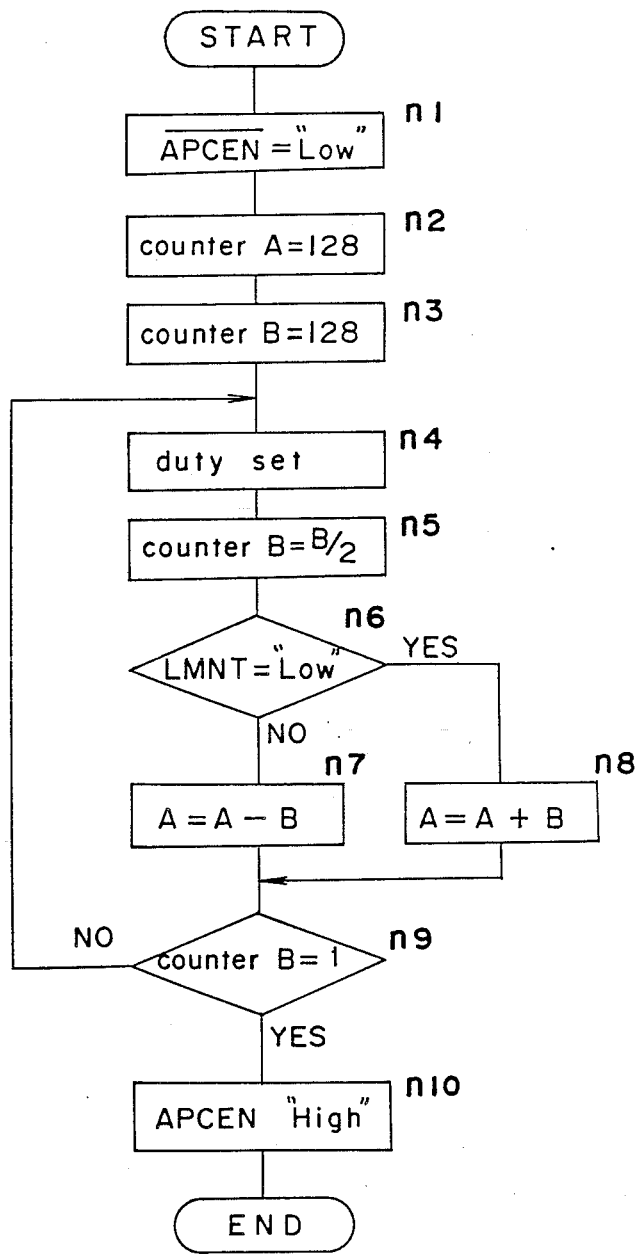
FIG. 3 is a flow chart showing the automatic power control operation of the apparatus.
Figure 4:
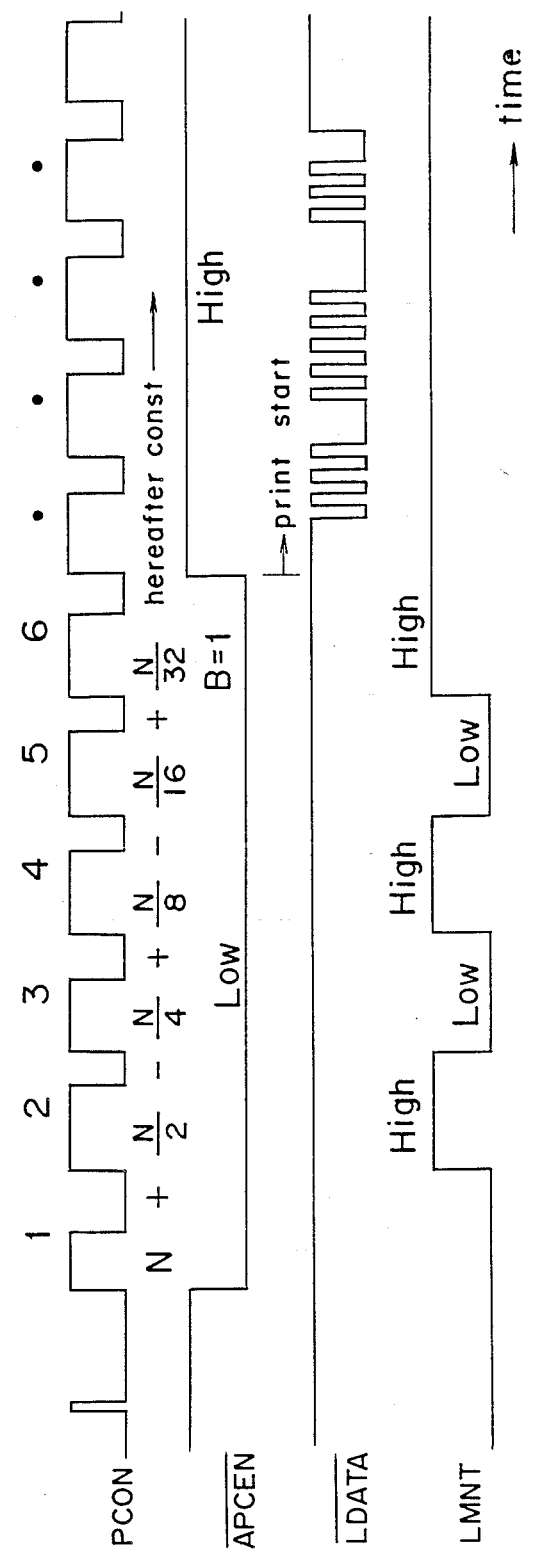
FIG. 4 is a time chart during the automatic power control operation of the apparatus.

FIG. 3 is a flow chart showing the operation of the automatic power control, and FIG. 4 is a time chart for the operation thereof.

At first, the CPU 1 turns the enable signal $\overline{\text{APCEN}}$ for the automatic power control into a low state (n1) and the CPU 1 also outputs a control start signal into the programmable duty controlling circuit 2. At this time, the programmable duty controlling circuit 2 sets a count value N (for example, 128) corresponding to the predetermined duty at a counter A, a counter (n2, n3).

Then, upon setting of the counter A at the count value N (n4), the laser power control signal (PCON) of the duty based on the count value N is transmitted (1 of the PCON, FIG. 4) by the programmable duty controlling circuit 2. Also, the counter B sets a control numerical value for the automatic power control, the control numerical value B halves the N (n5) to add this value to the value of the counter A or subtract the halved value from the value of the counter A as described hereinabove. The value of the counter A may be gradually approached into the object value through the repetition of the n4 through n9 loop.

The PCON signal which has been generated by the programmable duty controlling circuit 2 is smoothed into a DC analog signal by the smoothing circuit 3 so as to control the feed current into the laser diode 5 by the current conversion circuit 4.

The output from the laser diode 5, i.e., the output of the PIN diode 5' is compared (n6) with the reference voltage by the comparison circuit 6. As a result, the counter A of the programmable duty controlling circuit 2 is set (n7) to a value (N−(N/2)), which is provided through the subtraction of the control numerical value (N/2) from the count value N in accordance with the control signal to be inputted from the CPU 1 when the reference signal LMNT is "high". Also, when the reference signal LMNT is "low", the counter A is set (n8) to (N+N/2). The calculating operation is repeated before the value of the counter B becomes 1, the smallest value. When the value of the counter B becomes 1 (n9), the signal of B=1 is inputted into the CPU 1 by the programmable duty controlling circuit 2, the $\overline{\text{APCEN}}$ signal becomes "high" (n10) allowing the signal $\overline{\text{LDATA}}$ from the progress control unit 7 to turn the laser diode 5 on and off.

Figure 5:
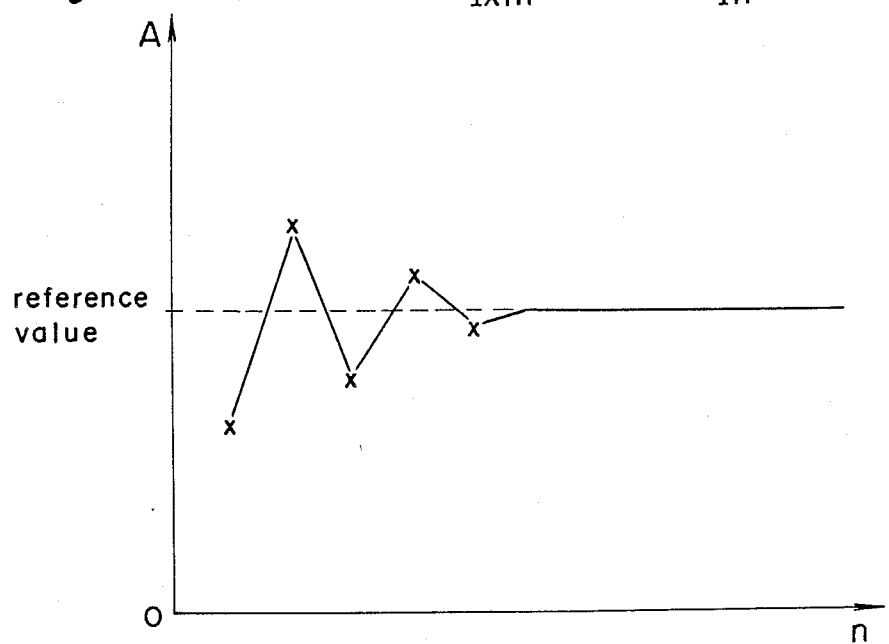
FIG. 5 is a chart showing the state of the counter A during the automatic power control operation.

FIG. 5 shows the operation of the automatic power control, with the axis of ordinates showing the value of the counter A, and the quadrature axis showing the frequency n of the automatic power control operation. When the output voltage of the laser diode 5 is smaller in accordance with the value of the counter A than the reference value as illustrated, the reference signal LMNT becomes "low". When the output voltage of the laser diode 5 is larger in accordance with the value of the counter A, the reference signal LMNT becomes "high". As illustrated, the value of the counter A gradually becomes closer to the target value through the repetition of the automatic power control operation.

As described hereinabove, the present invention compares the reference value with the output of the PIN diode for built-in monitoring use of the laser diode 5 to keep the output of the laser diode constant in accordance with the operation arranged in advance through the reference value.

It is to be noted that only the prior processing before the printing starts is described in the present embodiment. The comparison circuit 6 normally compares the reference voltage with the output voltage of the laser diode 5. The automatic power control operation may be performed with the $\overline{\text{APCEN}}$ signal being made "low" and the image not being formed, i.e., when the $\overline{\text{LDATA}}$ is "high".

Figure 6:
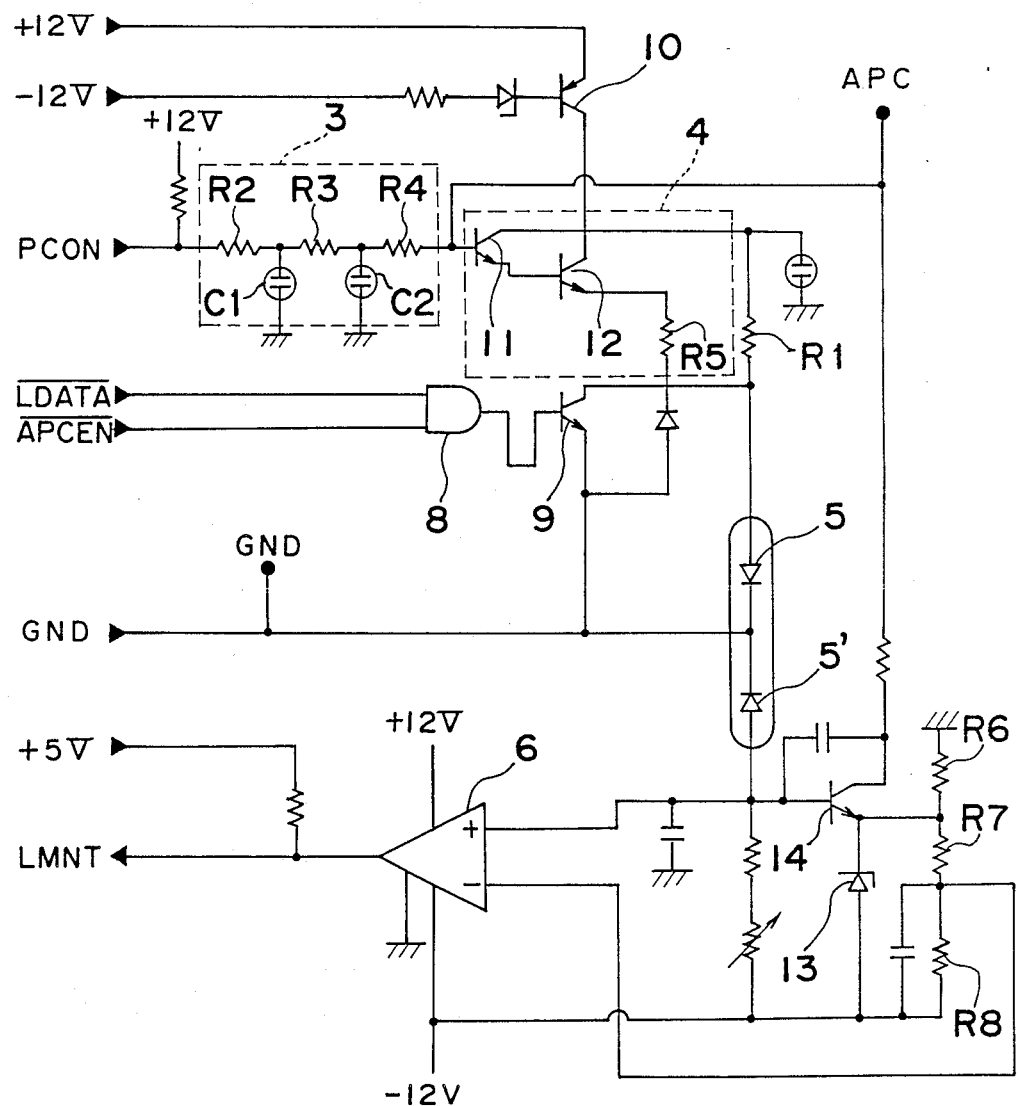
FIG. 6 is a block diagram showing the concrete construction of the essential portion of FIG. 1.

Referring to FIG. 6, there is shown the concrete construction of the essential portion of FIG. 1. The concrete operation will be described hereinafter with reference to the drawing.

The bias current up to the current Ixm of FIG. 2 is normally flowing through a transistor 10, and a resistor R1 into the laser diode 5. The output from the programmable duty controlling circuit 2 which programmably controls the pulse duty of the laser power control signal into many stages in accordance with the control stages to be inputted from the CPU 1 is fed into the current conversion circuit 4. The current conversion circuit 4 is composed of a transistor 11, a transistor 12 and a resistor R5 through R5. The current conversion circuit 4 is fed by the smoothing circuit 3 which is composed of resistors R2, R3, R4, capacitors C1, C2. The laser diode 5 is controlled by the current conversion circuit 4.

The light output from the laser diode 5 is detected by the diode 5' for feedback control use so as to be inputted into the comparison circuit 6 for comparison with the reference voltage. The reference voltage circuit which develops the reference voltage is composed of the resistors R6, R7, R8, with the comparison value being inputted into the CPU 1.

Also, at this time, when the output of the diode 5' for feedback controlling use is detected to be greater than or equal to the reference voltage by a zener diode 13, a transistor 14 is turned on so as to force the base electric potential of the transistor 11 to be lowered by the automatic power control (APC) to turn off the transistor 11. Therefore, the operation of the current conversion circuit 4 is prohibited and the application of current that is greater than or equal to a predetermined value of current is prevented from being applied to the laser diode 5. In addition, a data signal which is actually related to the record is fed into the laser diode 5 through the AND gate 8 and the transistor 9.

Accordingly, when the light output of that is greater than or equal to a predetermined value has been provided from the laser diode 5, the detected light output forces the current conversion circuit 4, which feeds the current into the laser diode 5, to break off and prevent the control elements from failing.

As described hereinabove, the bias current is normally applied upon the laser diode 5 and therefore, the control object period may be made Y (from Ixm to In), as only the control object period Y is divided into many stages for output control operation, so that the precise laser diode controlling operation may be effected.

As is clear from the foregoing description, the present invention comprises a duty controlling means which is capable of varying the duty into the pulse of a laser power control signal in accordance with a control signal to be inputted, a smoothing means for smoothing the laser power control signal controlled in duty by the duty controlling means, a current conversion means for feeding the signal smoothed by the smoothing means into the laser diode, an applying means for applying a given bias current into the laser diode, a comparing means for comparing the monitor output of the laser diode with the predetermined reference voltage, a central processing unit which responds to the output from the comparing means to guide a control signal into the duty controlling means to variably instruct the pulse duty of the laser power control signal. Therefore, the radiation output controlling operation may be effected only through the dividing of the control object period into many stages without a complicated circuit so as to provide a high-precision laser diode controlling apparatus.

Also, the present invention comprises a duty controlling means which is capable of varying the duty into the pulse of a laser power control signal in accordance with a control signal to be inputted, a smoothing means for smoothing the laser power control signal controlled in duty by the duty controlling means, a current conversion means for feeding the signal smoothed by the smoothing into the laser diode, a limiting means for restricting the top limit of the current to be fed into the laser diode, a comparing means for comparing the monitor output of the laser diode with the predetermined reference voltage, a central processing unit which responds to the output from the comparing means to guide a control signal into the duty controlling means to variably instruct the pulse duty of the laser power control signal. Therefore, when a light output that is greater than or equal to a predetermined value has been provided from the laser diode, the detected light output compulsorily cuts out a circuit which feeds the current to the laser diode. Thereby, a laser diode controlling is provided to prevent the control elements and so on from failing without the provision of a complicated circuit.

Although the present invention has been fully described by way of example with reference to the accompanying drawings, it is to be noted here that various changes and modifications will be apparent to those skilled in the art. Therefore, unless such changes and modifications depart from the scope of the present invention, they should be construed as being included therein.

What is claimed is:

1. A laser diode controlling apparatus for controlling a current supplied to a laser diode that is used for printing in a laser printing apparatus provided with a monitor that monitors light intensity of the laser diode by developing a monitoring signal related thereto, comprising:

comparing means for comparing the monitoring signal developed by the laser diode with a predetermined reference intensity signal and developing a reference signal in response thereto;

central processing means for developing a pulse signal representative of a desired light intensity level in response to said reference signal received from said comparing means;

duty cycle controlling means responsive to said pulse signal for developing a duty cycle control signal having a duty cycle related to the current to be supplied to the laser diode;

smoothing means for developing a DC analog signal by smoothing said duty cycle control signal; and current conversion means for supplying a drive current to the laser diode related to the DC analog signal, the laser diode developing light intensity related to said drive current;

said central processing means developing said pulse signal and thereby enabling adjustment of light intensity of the laser diode only during an initialization period preceding printing by the laser diode.

2. A laser diode controlling apparatus as defined in claim 1, further comprising:

applying means for applying a bias current to said laser diode in response to a video signal from said central processing means that switches said laser diode on and off during printing by the laser diode after said initialization period is completed.

3. A laser diode controlling apparatus as defined in claim 1, wherein said initialization period is developed in response to an automatic power control signal generated by said central processing means.

4. A laser diode controlling apparatus as defined in claim 1, wherein said central processing means comprises:
   (a) means for setting an initial count value corresponding to an initial value of said duty control signal;
   (b) means for initialization said count value as an initial iteration value;
   (c) means for dividing said iteration value by a predetermined iteration value to develop a current iteration value;
   (d) means for adding or subtracting said current iteration value to said count value in response to the value of said reference signal for revising said initial duty cycle signal; and
   (e) means for repeating steps (c) and (d) to develop increasingly accurate control of said current for producing light intensity of the laser diode at a predetermined constant intensity level, said steps of repeating being discontinued when said iteration value executes a predetermined number of iterations.

5. A laser diode controlling apparatus for controlling a current supplied to a laser diode that is used for printing in a laser printing apparatus provided with a monitor that monitors light intensity of the laser diode by developing a monitoring signal related thereto, comprising:
   comparing means for comparing the monitoring signal developed by the laser diode with a predetermined reference intensity signal and developing a reference signal in response thereto;
   central processing means for developing a pulse signal representative of a desired intensity level in response to said reference signal received from said comparing means;
   duty cycle controlling means responsive to said pulse signal for developing a duty cycle control signal having a duty cycle related to the current to be supplied to the laser diode, said duty cycle control signal being stored by said duty controlling means;
   smoothing means for developing a DC analog signal by smoothing said duty cycle control signal; and
   current conversion means for supplying a drive current to the laser diode related to the DC analog signal, the laser diode developing light intensity related to said drive current;
   said central processing means developing said pulse signal and thereby enabling adjustment of light intensity of the laser diode only during an initialization period preceding printing by the laser diode.

6. A laser diode controlling apparatus as defined in claim 5, further comprising:
   applying means for applying a bias current to said laser diode in response to a video signal from said central processing means that switches said laser diode on and off during printing by the laser diode after said initialization period is completed.

7. A laser diode controlling apparatus as defined in claim 5, wherein said initialization period is developed in response to an automatic power control signal generated by said central processing means.

8. A laser diode controlling apparatus as defined in claim 7, further comprising:
   applying means for applying a bias current to said laser diode in response to a data print signal from said central processing means that switches said laser diode on and off during printing by the laser diode after said initialization period is completed.

9. A laser diode controlling apparatus as defined in claim 7, wherein said duty cycle control signal is stored by said duty controlling means after said non-printing period is completed; and
   said duty cycle control signal being constantly supplied to the laser diode during said printing period.

10. A laser diode controlling apparatus as defined in claim 5, wherein said central processing means comprises:
    (a) means for setting an initial count value corresponding to an initial value of said duty control signal;
    (b) means for initialization said count value as an initial iteration value;
    (c) means for dividing said interation value by a predetermined iteration value to develop a current iteration value;
    (d) means for adding or subtracting said current iteration value to said count value in response to the value of said reference signal for raising said initial duty cycle signal; and
    (e) means for repeating said steps (c) and (d) to develop increasingly accurate control of said current for producing light intensity of the laser diode at a predetermined constant intensity level, said steps of repeating being discontinued when said iteration value executes a predetermined number of iterations.

11. A laser diode controlling apparatus for controlling a current supplied to a laser diode that is used in a laser printing apparatus, said laser diode being provided with a monitor that monitors light intensity output from the laser diode by developing a monitoring signal related thereto, said controlling apparatus varying the current during a non-printing period and disabling monitoring of light intensity output during a printing period, comprising:
    comparing means for comparing the monitoring signal devleoped by the laser diode with a predetermined reference intensity signal and developing a reference signal in response thereto;
    central processing means for developing a pulse signal representative of a desired intensity level in response to said reference signal received from said comparing means;
    duty cycle controlling means responsive to said pulse signal for developing a duty cycle control signal having a duty cycle related to the current to be supplied to the laser diode;
    smoothing means for developing a DC analog signal by smoothing said duty cycle control signal; and
    current conversion means for supplying a drive current to the laser diode related to the DC analog signal, the laser diode developing light intensity related to said drive current;
    said central processing means developing said pulse signal and enabling adjustment of light intensity of the laser diode only during an initialization period corresponding to said non-printing period preceding said printing period.

12. A laser diode controlling apparatus as defined in claim 11, wherein said central processing means comprises:

(a) means for setting an initial count value corresponding to an initial value of said duty control signal;
(b) means for initializing said count value as an initial iteration value;
(c) means for dividing said iteration value by a predetermined iteration value to develop a current iteration value;
(d) means for adding or subtracting said current iteration value to said count value in response to the value of said reference signal for revising said initial duty cycle signal;
(e) means for repeating said steps (c) and (d) to develop increasingly accurate control of said current for producing light intensity of the laser diode at a predetermined constant intensity level, said steps of repeating being discontinued when said iteration value executes a predetermined number of iterations.

13. A method for maintaining a current to a laser diode that outputs light at a predetermined constant intensity level by developing a current signal to be supplied to the laser diode in response to an interation operation performed in a central processing means comprising the steps of:
(a) setting an initial count value corresponding to an initial duty cycle signal;
(b) initializing said current value as an initial iteration value;
(c) dividing said iteration value by a predetermined iteration value to develop a current iteration value;
(d) developing a reference signal having a value indicative of whether the current signal supplied to the laser diode is greater than the predetermined constant intensity level;
(e) adding or subtracting said current iteration value to said count value in response to the value of said reference signal for revising said initial duty cycle signal; and
(f) repeating said steps (c)–(e) to develop increasingly accurate control of said current for producing light intensity of the laser diode at the predetermined constant intensity level, said step of repeating being discontinued when said iteration value executes a predetermined number of iterations.

* * * * *